US009935107B2

(12) United States Patent
Cea et al.

(10) Patent No.: US 9,935,107 B2
(45) Date of Patent: Apr. 3, 2018

(54) CMOS FINFET DEVICE WITH DUAL STRAINED CLADDING LAYERS ON RELAXED SIGE FINS, AND METHOD OF FABRICATING THE SAME

(71) Applicant: INTEL CORPORATION, Santa Clara, CA (US)

(72) Inventors: Stephen M Cea, Hillsboro, OR (US); Roza Kotlyar, Portland, OR (US); Harold W Kennel, Portland, OR (US); Kelin J Kuhn, Aloha, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/024,347

(22) PCT Filed: Dec. 16, 2013

(86) PCT No.: PCT/US2013/075437
§ 371 (c)(1),
(2) Date: Mar. 23, 2016

(87) PCT Pub. No.: WO2015/094164
PCT Pub. Date: Jun. 25, 2015

(65) Prior Publication Data
US 2016/0276347 A1 Sep. 22, 2016

(51) Int. Cl.
| | | |
|---|---|---|
| H01L 27/092 | (2006.01) |
| H01L 29/04 | (2006.01) |
| H01L 29/78 | (2006.01) |
| H01L 29/66 | (2006.01) |
| H01L 29/10 | (2006.01) |
| H01L 21/8238 | (2006.01) |

(52) U.S. Cl.
CPC .. *H01L 27/0924* (2013.01); *H01L 21/823807* (2013.01); *H01L 21/823821* (2013.01); *H01L 29/045* (2013.01); *H01L 29/1054* (2013.01); *H01L 29/66795* (2013.01); *H01L 29/785* (2013.01); *H01L 29/7842* (2013.01)

(58) Field of Classification Search
None
See application file for complete search history.

(56) References Cited

U.S. PATENT DOCUMENTS 7,348,284 B2 * 3/2008 Doyle .................. H01L 21/845
257/E21.633
2006/0033095 A1 2/2006 Doyle et al.
2006/0157687 A1 7/2006 Doyle et al.
(Continued)

FOREIGN PATENT DOCUMENTS

JP 2010-287675 A 12/2010
KR 10-2009-0017041 A 2/2009

OTHER PUBLICATIONS

International Preliminary Report on Patentability for PCT/US2013//075437, dated Jun. 30, 2016, 7 pages.
(Continued)

*Primary Examiner* — Marc Armand
*Assistant Examiner* — Younes Boulghassoul
(74) *Attorney, Agent, or Firm* — Jordan IP Law, LLC

(57) ABSTRACT

Techniques and methods related to dual strained cladding layers for semiconductor devices, and systems incorporating such semiconductor devices.

20 Claims, 8 Drawing Sheets

(56) References Cited

U.S. PATENT DOCUMENTS

| | | |
|---|---|---|
| 2007/0284613 A1 | 12/2007 | Chui et al. |
| 2008/0001187 A1 | 1/2008 | Booth et al. |
| 2009/0065853 A1 | 3/2009 | Hanafi |
| 2010/0163926 A1* | 7/2010 | Hudait ................ H01L 29/1054 257/190 |
| 2010/0252862 A1 | 10/2010 | Ko et al. |
| 2012/0319211 A1 | 12/2012 | Van Dal et al. |
| 2013/0092984 A1 | 4/2013 | Liu et al. |
| 2013/0270607 A1 | 10/2013 | Doornbos et al. |
| 2014/0264488 A1* | 9/2014 | Fronheiser ........ H01L 29/66795 257/288 |

OTHER PUBLICATIONS

European Search Report for European Patent Application No. 13899827, dated Jul. 5, 2017, 10 pages.

\* cited by examiner

US 9,935,107 B2

CMOS FINFET DEVICE WITH DUAL STRAINED CLADDING LAYERS ON RELAXED SIGE FINS, AND METHOD OF FABRICATING THE SAME

BACKGROUND

A typical metal-oxide-semiconductor field-effect transistors (MOSFETs) may include a semiconductor (for example, silicon), electrodes to contact a source region and a drain region, and an electrode to contact or couple with a gate. A FinFET is a MOSFET built around a thin strip of semiconductor material (generally referred to as the fin) extending upward from a plate shaped substrate. One end of the fin is the source region, while the opposite end of the fin is the drain region. The middle area of the fin forms a channel region which is covered by a gate dielectric and a gate electrode. The conductive channel of the device resides on the outer sides of the fin beneath the gate dielectric. Specifically, current runs along and within both sidewalls of the fin (the sides perpendicular to the substrate surface) as well as along the top of the fin (the side parallel to the substrate surface). Because the conductive channel of such configurations essentially resides along the three different outer, planar regions of the fin, such a FinFET is sometimes referred to as a trigate FinFET. Other types of FinFET configurations are also available, such as so-called double-gate FinFETs, in which the conductive channel principally resides only along the two sidewalls of the fin (and not along the top of the fin). A complimentary metal-oxide semiconductor (CMOS) has dual fins, one fin for a p-type transistor, and another fin for an n-type transistor. The dual fins are separated by an insulating oxide layer on an integrated circuit for example. The carrier mobility on such fin-based transistors may still be improved.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
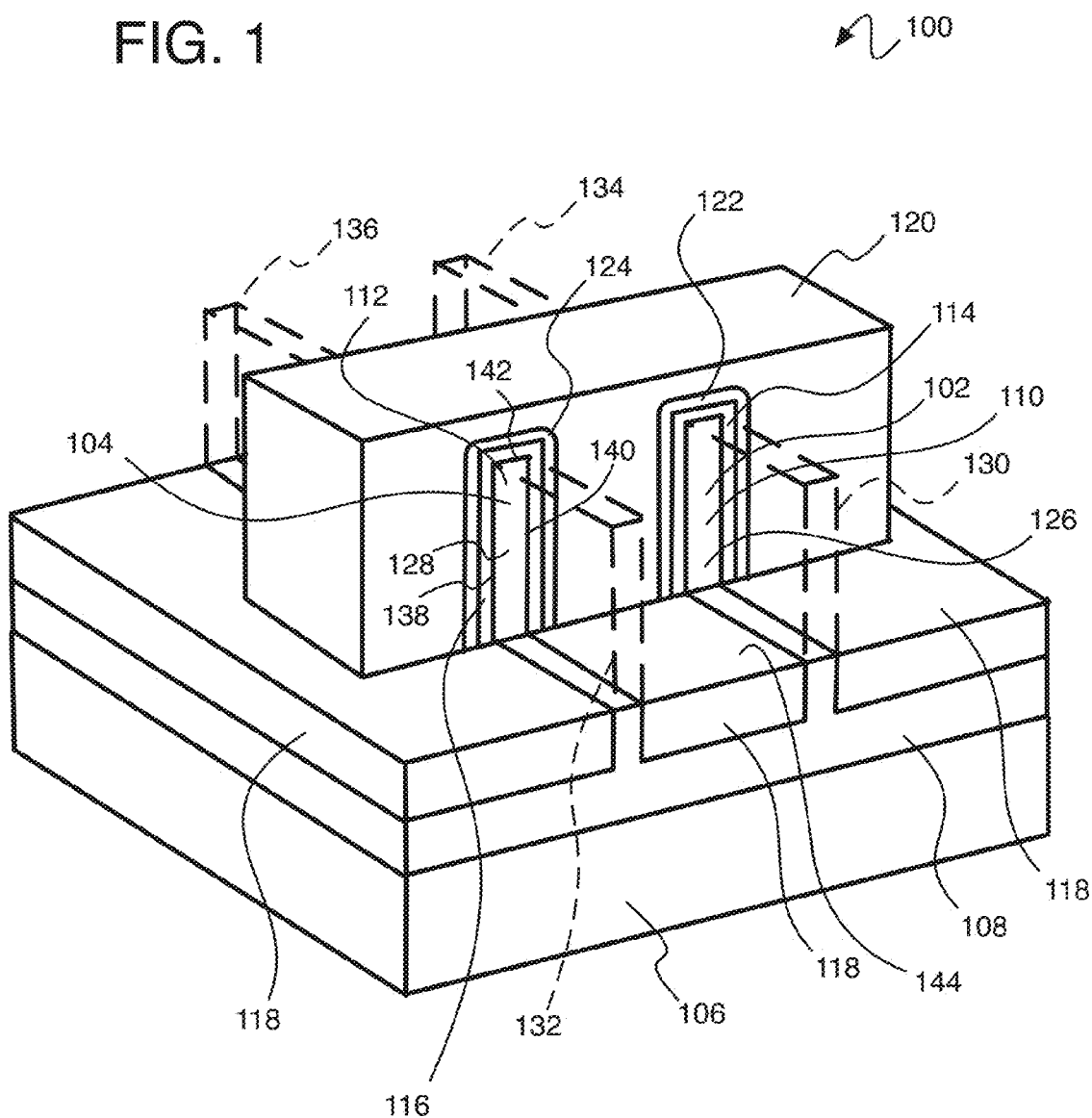
FIG. 1 is an upper perspective view of a dual complimentary metal-oxide semiconductor device.

One or more implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other implementations may be utilized and structural and/or logical changes may be made without departing from the scope of claimed subject matter. It should also be noted that directions and references, for example, up, down, top, bottom, and so on, may be used to facilitate the discussion of the drawings and are not intended to restrict the application of claimed subject matter. Therefore, the following detailed description is not to be taken in a limiting sense and the scope of claimed subject matter defined by the appended claims and their equivalents.

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an implementation" or "in one implementation" means that a particular feature, structure, function, or characteristic described in connection with the implementation is included in at least one implementation of the invention. Thus, the appearances of the phrase "in an implementation" in various places throughout this specification are not necessarily referring to the same implementation of the invention. Furthermore, the particular features, structures, functions, or characteristics may be combined in any suitable manner in one or more implementations. For example, a first implementation may be combined with a second implementation anywhere the two implementations are not specified to be mutually exclusive.

The terms "coupled" and "connected," along with their derivatives, may be used herein to describe structural relationships between components. It should be understood that these terms are not intended as synonyms for each other. Rather, in particular implementations, "connected" may be used to indicate that two or more elements are in direct physical or electrical contact with each other. "Coupled" my be used to indicate that two or more elements are in either direct or indirect (with other intervening elements between them) physical or electrical contact with each other, and/or that the two or more elements co-operate or interact with each other (for example, as in a cause and effect relationship).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features. Additionally, the terms "under" or "over" or "down" or "up" and/or similar terms relating to relative position are meant to express internal relative positioning between components and do not necessarily mean upward or downward relative to the earth unless stated otherwise.

Devices, microprocessors, apparatuses, computing platforms, and methods are described below related to dual strained cladding layer for semiconductor devices.

Many semiconductor devices have both p-type and n-type fins, which may or may not be positioned relatively close to each other on a wafer. One such example is a complementary metal oxide semiconductor (CMOS) device that may have dual fins including a p-type fin adjacent a parallel n-type fin separated by an insulation layer. Difficulties occur when trying to increase the efficiency of both fin types because the p-type fins and n-type fins have different characteristics. Germanium (Ge) for example is often used to increase the hole mobility on p-type fins but may reduce electron mobility on n-type fins. Thus, it is desirable to treat the p-type and n-type fins differently This problem may arise when applying a strained cladding layer to the fins. A strained cladding layer may be deposited on the fin in order to increase the mobility of the charge carriers at the interface between the outer walls of the fins and the gate dielectric, which may increase the speed in which the semiconductor device can operate, thereby increasing performance and lowering energy consumption. A strained cladding layer is formed when a material is pseudomorphically grown on a fin (called the core or semiconductor body herein) and the core and the cladding layer have different lattice constants. The difference in lattice constant between the core and clad layers causes both the core and the cladding layer to be strained. The amount of strain and direction of the strain in each will be determined by their thicknesses, relative stiffness, location of their free surfaces, and the degree of lattice mismatch between the deposited cladding layer material and the underlying fin core. By properly choosing wafer orientation, a common core, and different cladding layers for both NMOS and PMOS devices, strained layers with high mobility and drive currents can be formed for both NMOS and PMOS layers. For example a relaxed silicon germanium (SiGe) core built on a (110) wafer with tensile Si cladding for NMOS and compressive Ge cladding for PMOS will result in high electron and hole transport. Instead of Ge, a SiGe PMOS cladding layer may be used that has a Ge concentration that is larger than the Ge concentration of the SiGe core.

A cladding layer is often obtained by using a blanket or non-selective deposition that covers both the p-type and n-type fins with the same cladding layer material. As mentioned, this will not provide the most efficient mobility for both charge types due to the different materials involved, or may require additional manufacturing steps to remove or replace the cladding layer from the fins having one type of charge carrier.

Referring to FIG. 1, various implementations described herein overcome the difficulties mentioned above, and in one illustrated example, an integrated circuit may have a transistor or semiconductor device 100 provided with upstanding semiconductor bodies 102 and 104, also referred to as semiconductor fins, fin portions, or cores. The semiconductor bodies 102 and 104 may be provided over a substrate 106 and a relaxed layer 108 made, in one example, of SiGe, and forming the semiconductor bodies 102 and 104. In this example, the semiconductor body 102 is p-type, and the semiconductor body 104 is n-type. The layers 114 and 116 with different materials depending on the carrier charge of the semiconductor body. In one form, the cladding layer 114 over the p-type semiconductor body 102 is Ge or SiGe with a greater fraction of Ge than the amount of Ge in the semiconductor body. The n-type semiconductor body 104 may have a cladding layer 116 of Si with a lattice constant smaller than the lattice constant of the n-type semiconductor body 104. In order to fabricate the semiconductor device, a non-selective or blanket cover is deposited on the semiconductor devices, and openings or perforations are formed through the cover at semiconductor bodies with one charge carrier type (such as p-type for example). A first cladding layer is then selectively grown on the semiconductor bodies of one carrier charge type (such as the p-type) and not on the semiconductor bodies with the other charge carrier type (such as n-type by example). Once the first cladding layer is grown, the used cover is easily removed, and a new cover may be deposited and perforated at certain locations to grow a second cladding layer of a different material on the semiconductor bodies with the other charge carrier (such as the n-type semiconductor bodies). This process is explained in greater detail below with FIGS. 2-12.

More specifically, semiconductor device 100 may be formed on a wafer as part of an integrated circuit die. The semiconductor device may be one of a plurality of semiconductor devices on the wafer whether tens, hundreds, thousands, or more of semiconductor devices on the wafer. Microelectronic device 100 may be part of a microprocessor, a static random access memory (SRAM) circuit, or a portion of an SRAM cache memory of a microprocessor, or the like to name a few non-limiting examples.

Semiconductor device 100 may be a non-planar, finFET with at least one p-type semiconductor body or fin 102 and at least one n-type semiconductor body or fin 104. It may be formed on a bulk crystalline semiconductor substrate or it may be formed on a semiconductor on insulator (SOI) structure. The fins may be arranged in many different orientations on the wafer. Thus, in one form, fins of like carrier charge may be grouped together, or alternatively, or additionally, fins of different carrier charges may be alternating or paired with one p-type fin adjacent an n-type fin as with complementary metal-oxide semiconductors (CMOS). Thus, the semiconductor device may be part of an integrated circuit with many such semiconductor devices, or may be an isolated semiconductor device on the integrated circuit. Otherwise, the semiconductor device may be on its own chip or die for example. With the integrated circuit, the semiconductor device may still be isolated where a dual pair of single p-type or n-type fin have their own gate without any relatively near semiconductor devices on the circuit, or the semiconductor device may be nested within a long line or 2D network of similar, parallel semiconductor devices. It will be understood that while the fins and/or semiconductor bodies are discussed as being p-type or n-type during the initial fabrication steps, this distinction may not actually occur until the well doping, sub-fin doping, gate metals, and/or source and drainage regions of the semiconductor bodies are formed creating different NMOS and PMOS transistors.

The basic transistor elements of the semiconductor device 100 include the substrate 106, the relaxed SiGe layer 108 formed over or on the substrate, and upstanding semiconductor bodies or fins 102 and 104 mentioned above and that are separated by an insulation layer 118 (also referred to as trench isolation or simply an isolation). A gate electrode 120 extends over, and transverse to, the semiconductor bodies 102 and 104. Cladding layers 114 and 116 as well as dielectric layers 122 and 124 are disposed over channel regions 126 and 128 of the semiconductor bodies 102 and 104 and underneath the gate electrode 120. The semiconductor bodies 102 and 104 also have source regions 130 and 132, and drain regions 134 and 136, shown in dashed line for clarity.

As mentioned above, the semiconductor device 100 may be an isolated transistor where there is one gate electrode between trench isolation along the current flow direction. Otherwise, the semiconductor device 100 may be a portion of an elongated circuit in the fin direction. In other words, in the current flow (or along the fin) direction, nested transistors may be provided where a single fin contains more transistors between the trench isolation.

Figure 2:
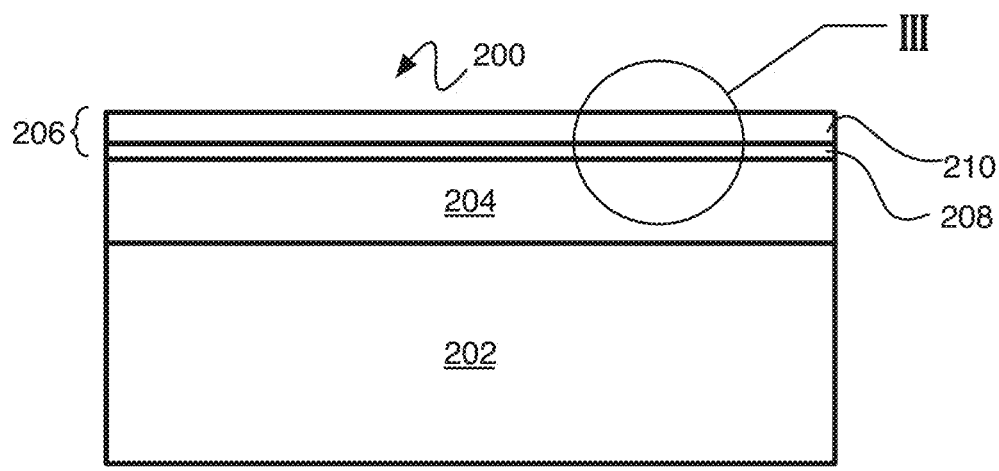
FIGS. 2-8 are cross-sectional views of example transistors as particular fabrication operations are performed.
Figure 3:
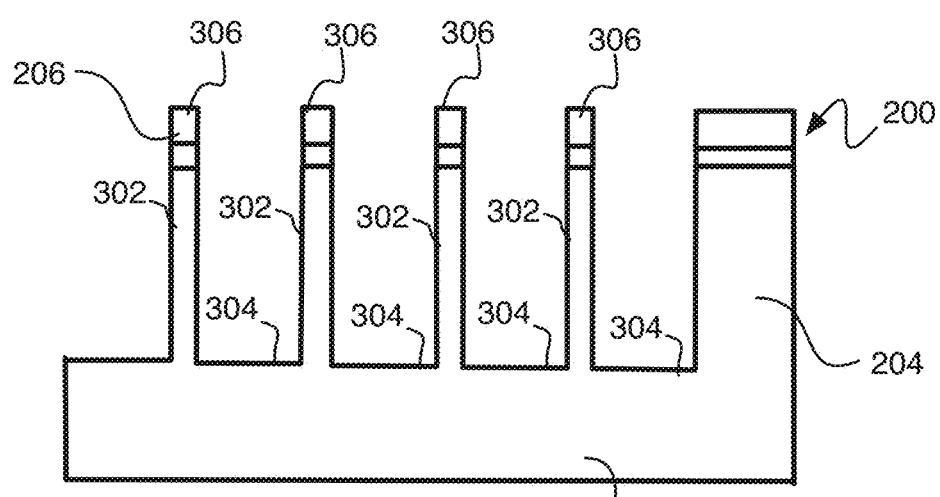
Figure 4:
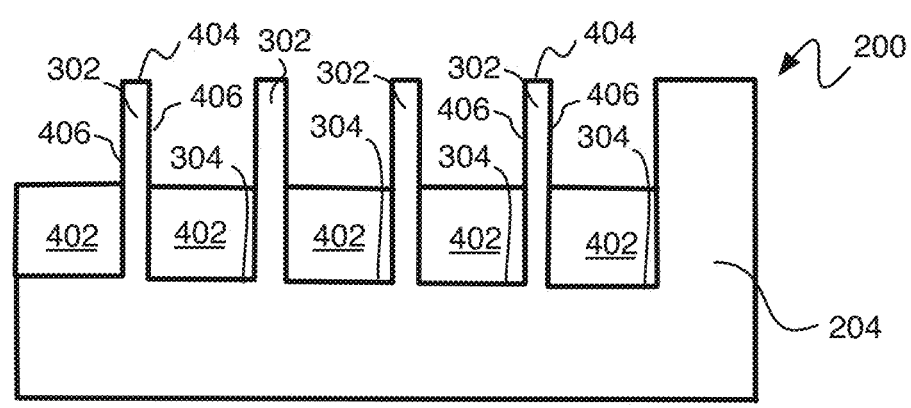

Referring to FIGS. 2-4, a cross-section of semiconductor device 200 is shown in various states during fabrication of the semiconductor bodies, such as for semiconductor device 100. The cross-sections extend along the gate electrode and transverse to the semiconductor bodies (or fins) to provide a section through the channel regions of each of the semiconductor bodies shown. Referring to FIG. 2, in an initial stage, a semiconductor substrate 202, to form substrate 106 for instance, may be composed of undoped monocrystalline silicon (Si) in some forms. Otherwise, the substrate may be formed of SiGe, a germanium substrate, a silicon germanium alloy, a gallium arsenide, InSb, and GaP. While the semiconductor substrate 202 here is an intrinsic (for instance, undoped) silicon substrate, in other forms the substrate 202 may be doped to a p type or n type conductivity.

Also, in one example, the semiconductor substrate 202 may include a (110) normal surface, or (110) normal orientation, so that the relaxed layer also has a (110) normal surface.

A layer or film 204 of relaxed SiGe may be epitaxially grown on the substrate 202, and may be formed of $Si_{(1-x)}Ge_x$ where x is approximately 0.2 to 0.9, and by one approach 0.2 to 0.9. In one form, x is 0.3 to 0.7, and in another form $Si_{0.50}Ge_{0.50}$ is used as the material for the relaxed layer 204. The relaxed SiGe layer 204 may be epitaxially grown. Relaxed film maintains its own crystal lattice parameters in all directions rather than conform to the lattice structure of the material of the layer that the relaxed layer is deposited upon. This is accomplished by intentionally permitting defects or dislocations to exist in the relaxed layer so that the lattice structure of the deposited layer and substrate no longer line up. These defects, however, may cause undesirable matching defects in further semiconductor layers grown on the relaxed layer. Thus, techniques exist to attempt to maintain the defects away from the top or upper portions of the relaxed layer by forming the relaxed layer relatively thick. This includes a relaxed buffer layer technique or by using aspect ratio trapping (ART) to locally form relaxed SiGe.

The buffer layer technique may include growing the buffer layer in a stack of buffer sub-layers where each sub-layer may have a greater lattice constant than the buffer sub-layer below it. For a $Si_{(1-x)}Ge_x$ layer, this can be accomplished by increasing the concentration of Ge with each higher buffer sub-layer. The ART technique relies on trapping of dislocations at oxide sidewalls and could be used to grow relaxed SiGe fins that would be used as the core of the dual strained layers. In either case, the relaxed SiGe layer 204 is formed relatively thick (or in other words, high on FIG. 2) so that the defects do not extend to the upper or outer areas of the relaxed layer, that are to interface with the cladding layers, resulting in less defects in the upper regions forming the interface to the semiconductor cladding layers to be deposited onto the relaxed layer 204. By one form, this may mean the defects are to be kept out of the semiconductor bodies entirely, or at least substantially reduced in the semiconductor bodies, and only within the base 212 (FIG. 3) of the relaxed layer 204 below the trenched area described below. By an alternative approach as shown in FIG. 1 for example, the cladding layers 114, 116 extend down to the isolation layer 118, but do not extend the entire height of the semiconductor bodies 102, 104. Thus, by one approach, the initial, un-trenched, relaxed SiGe layer may be about 3000 to 10000 Å high. From the relaxed layer, semiconductor bodies or fins may be formed about 1000 to 1400 Å tall, and in one form approximately 1200 Å, and in another form 1200 Å tall, where the defects are maintained mainly to the bottom third of the semiconductor body or fin, Thus, in one case, for semiconductor bodies or fins approximately 1200 Å tall, the defects may be kept closer to approximately the bottom 300 Å of the relaxed layer 204.

Once the relaxed layer 204 is formed, a mask 206 may be deposited and patterned on the relaxed layer 204. In some forms, the mask 206 may include a hardmask such as, for example, silicon oxide, and may be an oxidation resistant mask. In one form, the mask 206 may include a lower, thin pad oxide layer 208, such as silicon dioxide, and a thicker, upper layer 210 of a nitride, such as silicon nitride, or other oxidation resistant layer. These layers may be blanket deposited over the relaxed layer 204. In some approaches, the mask 206 may be a photo-definable material. Photolithography techniques may then be used to mask, expose, and develop a photoresist masking layer over locations where mask portions 306 are to be formed. The nitride film 210 and the pad oxide layers 208 are etched in alignment with the formed photoresist mask to form mask portions 306. Mask portions 306 may define active regions in relaxed layer 206 where semiconductor bodies 302 are to be formed.

Referring to FIG. 3, which is a close-up at III of FIG. 2, the exposed portions of relaxed layer 204 are etched, such as by an anisotropic etch process, and in alignment with the outside edges of mask portions 306 to form semiconductor bodies or fins 302, and trenches 304 between the semiconductor bodies 302. The trenches 304 are etched to a depth sufficient to isolate adjacent transistors from one another.

An insulation or isolation layer 402 (FIG. 4) is deposited in the trenches 304 to form shallow trench isolation STI regions, and may be formed of a dielectric or electrically insulative material. The electrically insulative material may include any suitable material for shallow trench isolation (STI). In some forms, the electrically insulative material for the insulation layer 402 may include dielectric materials known for their applicability in integrated circuit structures, such as low-k dielectric materials. Examples of dielectric materials that may be used for insulation layer 402 include, but are not limited to, silicon oxide, carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass.

By one approach, the insulation layer 402 may be formed by first growing a thin liner oxide in the bottom of the trenches 304. Next, trenches 304 are filled by blanket depositing an oxide dielectric layer over the liner oxide by, for example, a high density plasma (HDP) chemical vapor deposition process. This blanket deposition leaves the insulation layer 402 within the trenches 304 and on mask portions 306. The portions of the insulation layer 402 on the mask portions 306, and the mask portions 306 themselves, may be removed using chemical mechanical polishing creating a flat surface of layers 302 and 402. The insulation material within the trenches 306 then may be etched to a certain depth using either wet or dry etching techniques that are selective to the layer 302. This leaves the structure with insulation layer 402, similar to insulation layer 118, in the bottom of the trenches 304 while exposing the top 404 and sides 406 of the semiconductor bodies 302, and ready for receiving the cladding layers, as shown on FIG. 4.

Figure 9:
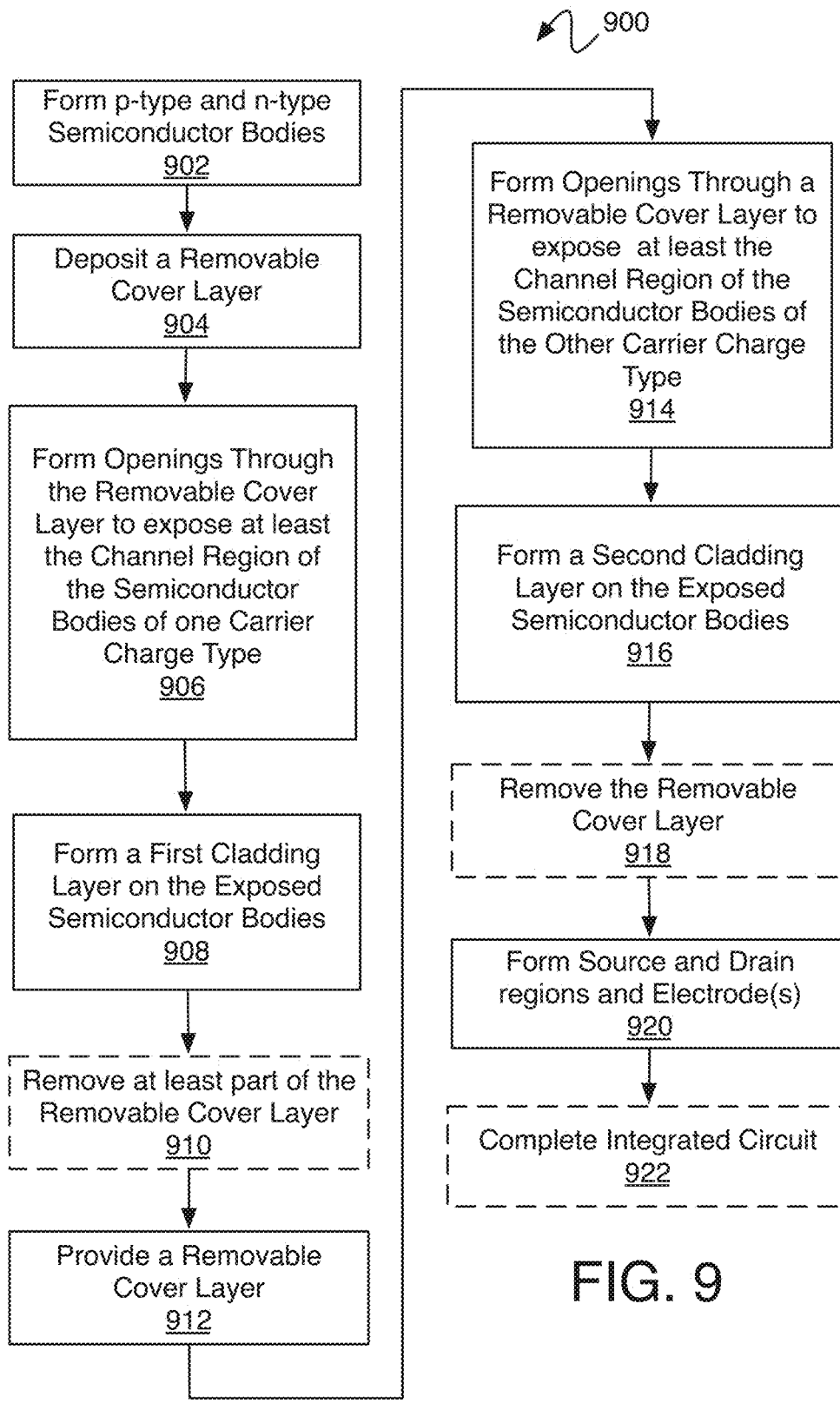
FIG. 9 is a flow diagram illustrating a process for forming a cladding layer on a fin of a semiconductor device.
Figure 10:
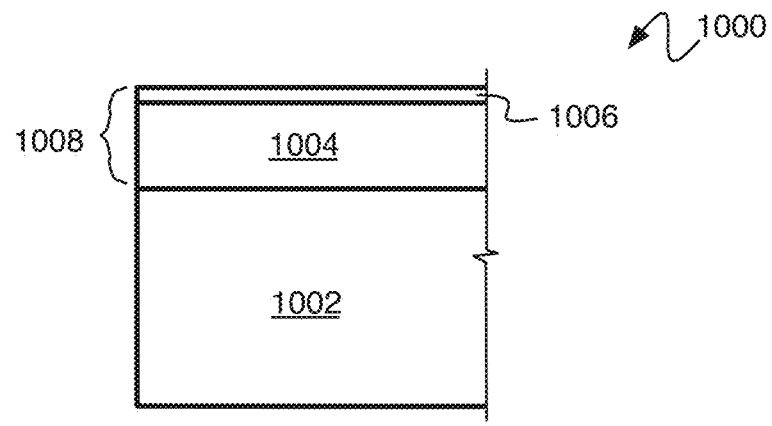
FIGS. 10-12 are cross-sectional views of other example transistors as particular fabrication operations are performed.
Figure 11:
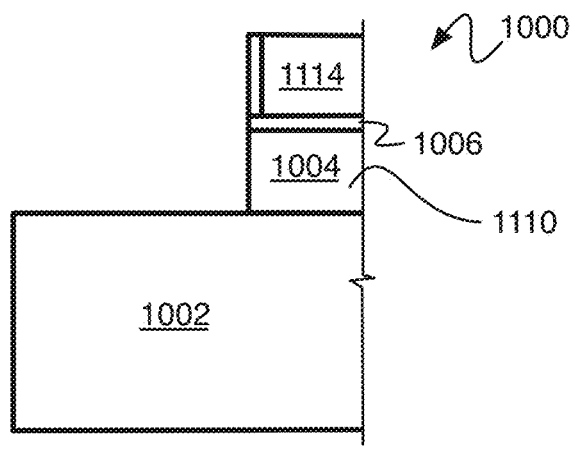
Figure 12:
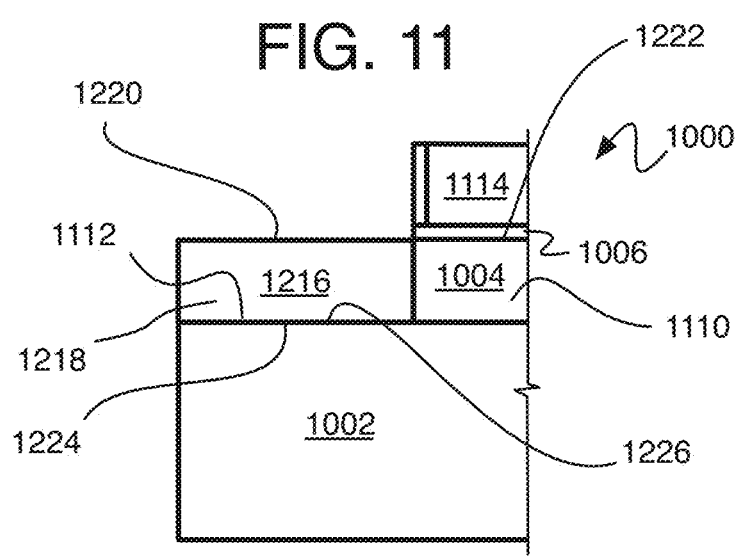

FIGS. 5-8 show the semiconductor device 200 in various states for the fabrication of the cladding layers and is referred to in conjunction with the method 900 of fabrication of FIG. 9. Process 900 is provided for forming strained cladding layers on dual fins of a semiconductor device, and more particularly, different cladding layers for p-type and n-type semiconductor bodies on a semiconductor device, arranged in accordance with at least some implementations of the present disclosure. In the illustrated implementation, process 900 may include one or more operations, functions or actions as illustrated by one or more of operations 902 to 922 numbered evenly. Implementations herein, however, may include any number of operations such that some of the operations may be skipped or the like. Further, various implementations may include additional operations not shown for the sake of clarity. Also, in general, with the techniques described with respect to FIG. 9, process 900 provides an example method for forming the semiconductor structure of FIGS. 1-8 and may or may not include the source and drain regions of FIGS. 10-12; however, other methods may be available for forming such structures.

The process 900 may include, as already described above, an operation to "form p-type and n-type semiconductor bodies" 902, and more specifically, to form at least one p-type semiconductor body and at least one n-type semiconductor body over a substrate. By one approach, each semiconductor body has a source region, a channel region, and a drain region, and at least the channel region is formed of a material that comprises SiGe. As explained above, the material may be a relaxed SiGe.

Figure 5:
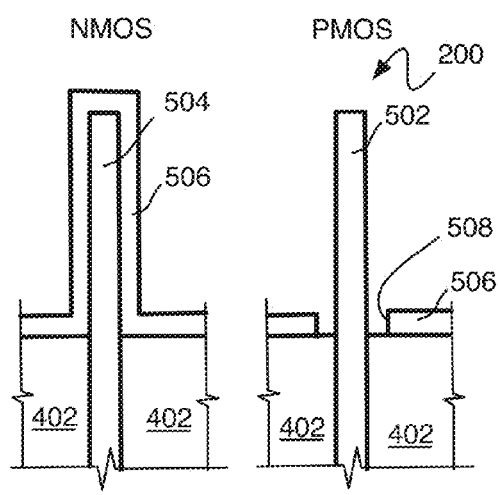

Referring to FIG. 5, by one form, once a p-type metal oxide semiconductor (PMOS) body or fin 502 is formed extending up from the insulation layers 402, and an n-type metal oxide semiconductor (NMOS) body or fin 504 is formed extending up from insulation layers 402, the process may proceed with forming the cladding layers. It will be understood, as mentioned above, the p-type and n-type semiconductor bodies may or may not be located directly adjacent to each other such that both the n-type and p-type semiconductor bodies 502 and 504 contact the same insulation layer or layer portion 402 disposed between the two semiconductor bodies.

The process 900 may continue with an operation to "deposit removable cover layer" 904, and by one example, to first cover at least the n-type semiconductor body or bodies 504 to place a first cladding layer on the p-type semiconductor body or bodies 502. In another form, this operation may include blanket depositing a removable cover layer over at least part of the semiconductor bodies of both a first carrier charge type and a second carrier charge type, where the first and second carrier charge types are different and comprise p-type or n-type. As shown in FIG. 5, a cover layer 506, also referred to as a mask, may be blanket deposited by chemical vapor deposition (CVD), and in one form low temperature CVD, or atomic layer deposition (ALD) over the wafer. Such a cover may be made of an oxide or nitride such as silicon dioxide or silicon nitride.

The cover layer 506 then may be patterned using photolithography to "form openings through the removable cover layer to expose at least the channel region of the semiconductor bodies of one carrier charge type" 906, such as opening 508 on FIG. 5 formed to expose the p-type semiconductor bodies 502. Selective epitaxial growth or other similar deposition processes may be used to "form a first cladding layer on the exposed semiconductor bodies" 908, or more specifically, on the exposed semiconductor bodies of the first carrier charge type. In the illustrated example, the n-type semiconductor body 504 remains covered while the first cladding layer 602 is grown on the exposed p-type semiconductor body 502. The first cladding layer 602 may be grown to cover the sidewalls 406 and top surface 404 of the semiconductor body 502. The cladding layer may be a thickness of 10 to 30 Å, and in other examples approximately 15 Å, approximately 20 Å, 15 Å, or 20 Å.

The cladding layer 602 on the p-type semiconductor bodies, or first cladding layer, 602 by one example, may be formed of $Si_{(1-y)}Ge_y$, where y is greater than x, or in other words, the Ge concentration in cladding layer 602 is greater than the Ge concentration in p-type semiconductor body 502. This causes strain in the cladding layer that may be proportional to the difference in Ge % in the core and the clad. For example, a core with 50% Ge and cladding layer with 100% Ge may result in a strain of 100/50 or approximately 2% of the lattice dimensions in the strain direction. This causes and sustains a compressive strain in the cladding layer 602 both along the current flow direction and vertically, which improves hole mobility in the cladding layer since the majority of the carriers exist at the cladding layer. The epitaxial growth also causes the crystal lattice of the cladding layer 602 to match the orientation of the lattice of the semiconductor body 502 providing a (110) channel direction (where the 110 face of the lattice is facing the current flow direction), the sidewalls of the cladding layer have (100) surfaces, and a (110) surface is provided, meaning the upper, facing surface also is (110).

Figure 6:
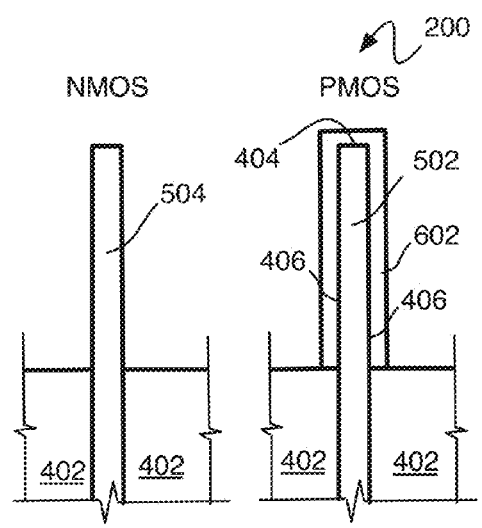
Figure 7:
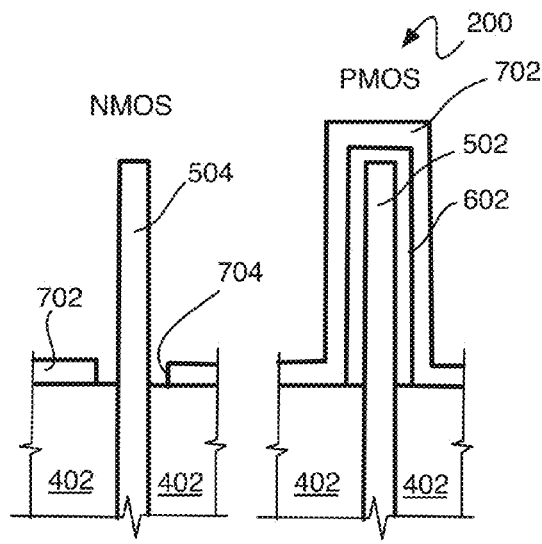
Figure 8:
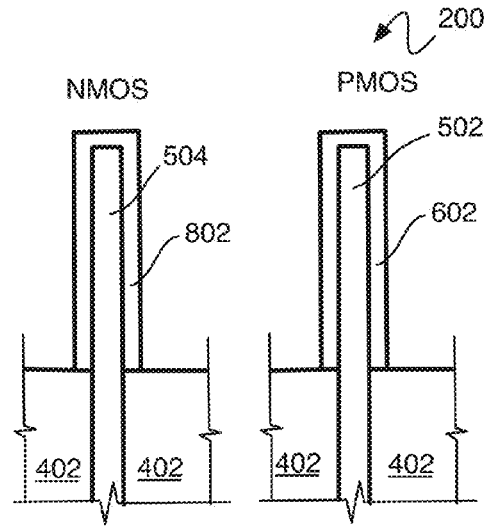

Once the first cladding layer 602 is formed, an operation may be performed to "remove at least part of the removable cover layer" 910 as well as any excess cladding material on the cover layer. The cover layer 506 may be removed by dry or wet etching for example, resulting in the uncovered structure with the cladding layer 602 over the p-type semiconductor body 502 as shown in FIG. 6.

For this approach, the first cover layer 506 may be entirely removed before the process continues to "provide a removable cover layer" 912, and in one form, provide a removable cover layer over at least part of the semiconductor bodies of the first carrier charge type. Thus, by the illustrated example, a new, second cover layer 702 (FIG. 7) of similar material to the first cover layer 506, may be blanket deposited over the wafer and semiconductor bodies of both charge types. Alternatively, it will be understood that the first cover layer 506 may remain in place over the n-type semiconductor body 504 while the new cover layer 702 is either blanket deposited, or otherwise selectively deposited, over the first cladding layers 602, and in turn over the p-type semiconductor bodies 502, although this alternative may create a double, over-lapped layers to be etched off subsequently.

In either case, the process 900 then includes an operation to "form openings through a removable cover layer to expose at least the channel region of the semiconductor bodies of the other carrier charge type" 914, and in one form, with an opening 704 to expose the n-type semiconductor bodies 504 using the same or similar processes mentioned above to expose the p-type semiconductor bodies 502. Once exposed, the process 900 continues to "form a second cladding layer on the exposed semiconductor bodies" 916, and in one form, on the semiconductor bodies of the second carrier charge type, which may be a cladding layer 802 (FIG. 8) on the n-type semiconductor bodies 504. The cladding layer may be a thickness of 10 to 30 Å, and in one example approximately 15 Å, approximately 20 Å, 15 Å, or 20 Å.

For the cladding layer 802 deposited on the n-type semiconductor bodies, the material comprises silicon with a crystal lattice constant that is smaller than that of the lattice constant of the n-type relaxed SiGe semiconductor body 504. For the example of a 50% SiGe core and Si cladding the strain in the Si will be approximately 2% tensile strain. The cladding layer is selectively epitaxially grown on the relaxed SiGe semiconductor body 504 so that cladding layer 802 is strained under tensile stress to stretch toward the crystal lattice structure of the relaxed SiGe semiconductor body 504 as explained above.

Once the second cladding layer 802 is deposited, the process 900 may include an operation to "remove the removable cover layer" 918. As mentioned above, this may include removing a second cover layer 702, or it may include removing both the first and second removable cover layers. This may be performed by wet or dry etching processes mentioned above. This results in the structure shown on FIG. 8 where both the p-type and n-type semiconductor bodies 502 and 504 have different cladding layers 602 and 802.

The process 900 may also include "form source and drain regions and electrodes" 920. By one approach, while referring to FIGS. 10-12, the source and drain regions may be formed by providing a doped Si source/drain region for n-type semiconductor bodies, and doped SiGe or Ge source/drain region for the p-type semiconductor bodies. These would be formed by etching out the cladding and semiconductor body layers in the source and drain regions using either wet or dry etching and epitaxially growing in doped Si, SiGe or Ge sources and drains. In one example form, the materials of the drain and source regions are the same or similar to that of the cladding layers on the same semiconductor body such that the n-type Si source or drain layer may be formed with a crystal lattice structure with a lattice constant that is lower than the constant of the relaxed SiGe semiconductor body material combined with the cladding layer at the channel region to produce further tensile-based strain in the source drain and channel regions. Similarly, the p-type source and drain layers may have a SiGe with a larger fraction of Ge (including Ge alone) than in the relaxed SiGe semiconductor body to form a larger lattice constant than that of the channel region, and to produce increased compressive strain in the source and drain and channel regions, thereby increasing mobility. The epitaxial source and drains can also be optimized to provide good external resistance $R_{ext}$. In one form, the source and drain regions have the same base material as the cladding layers (same mole count, and so forth), and in other forms, the materials may be the same Si or Ge elements but with a slightly different compound. Thus, in one form, Ge may be used as the p-type cladding layer while SiGe (or Ge) in the source and a drain (S/D) would be provided with higher Ge concentration than the average in the channel to increase the compressive stress in the channel. By other alternatives, the source and drain regions may be different materials with different elements.

By an alternative, the relaxed SiGe layer may be maintained at the source and drain region and doped using implantation and annealing or indiffusion from a solid source.

By one form, the relaxed SiGe material of the semiconductor body and cladding layers extend along the semiconductor body, beyond the length of the channel region, and in some forms through the source and drain regions of the semiconductor body for the entire length of the semiconductor body. In these cases, a side, cross-section of exemplary semiconductor device 1000 (taken 90 degrees from FIGS. 2-8 for example, and from an end of the device to the channel region), reveals a side of a relaxed SiGe fin or semiconductor body 1004 and cladding layer 1006 extending the length of a non-trenched, relaxed SiGe layer or substrate 1002. In this case, the relaxed semiconductor body 1004 and cladding layer may be maintained at the channel region 1110 and etched away at the source or drain region 1112, by one example, dry or wet etching may be used to remove the semiconductor body and cladding layers, leaving a substrate for the epitaxially grown source drains.

Once cleared, a source or drain layer 1216 may be deposited within, or to fill, the source or drain region 1112 by growing the layer through selective epitaxial growth, for one example. The source and drain regions 1216 may then be doped appropriately to obtain the desired p-type or n-type semiconductor body 1218. The source or drain layer 1216 may similarly correspond to any of the source or drain regions mentioned herein such as source regions 130 and 132, and drain regions 134 and 136 of FIG. 1. It also will be understood that the drain or source region 1216 may be grown to have the same or similar or otherwise corresponding cross-sectional dimensions of the relaxed SiGe semiconductor body to maintain a continuous fin by one example. By one form, the top surface 1220 of the source or drain layer 1216 may be at the same height as the top 1222 of the semiconductor body 1004 at the channel region 1110. The bottom surface 1224 of the source or drain layer 1216 may be on or at the fin-shaped base portion 1226 of the relaxed SiGe semiconductor body and that aligns with the top surface of 144 of the insulation layers 118 as shown in FIG. 1. Otherwise, the source and drain layers may have different dimensions or shapes, such as a curved bottom surface by one example.

By one approach, the source/drain regions have a doping concentration of between approximately $1 \times 10^{19}$ to $2 \times 10^{21}$ atoms/cm$^3$, and in one form, at least approximately $7 \times 10^{20}$ atoms/cm$^3$. The source/drain regions can be formed of uniform concentration or can include sub-regions of different concentrations or doping profiles, such as tip regions (for example, source/drain extensions). In one form, when transistor 1000 is a symmetrical transistor, the source and drain regions will have the same doping concentration profile. In another form, transistor 1000 is an asymmetrical transistor, and the source region and drain region may have varied doping in order to obtain particular electrical characteristics.

A gate 1114 may also be formed and may include a gate dielectric such as gate dielectric 122 or 124 (FIG. 1) and a gate electrode 120 (FIG. 1). This may include forming the gate dielectric layer 122 or 124 over the cladding layers 114 or 116 respectively, and at the channel regions 1110 of the semiconductor bodies 1004. Such a dielectric layer may be a grown gate dielectric layer, such as but not limited to a silicon dioxide layer, a silicon oxynitride layer or a combination thereof. A silicon oxide or silicon oxynitride layer can be grown on cladding layers 1006, similar to cladding layers 602 or 802 (FIG. 8), or 114 or 116 (FIG. 1) using dry/wet oxidation processes. When the gate dielectric layer 122 or 124 is grown, in one example, it may be formed selectively only on semiconductor containing areas, such as the cladding layers 114 and 116 (FIG. 1) or cladding layers 602 and 802, and not on isolation or insulation regions 402 or 118. Alternatively, gate dielectric layers 122 and 124 can be a blanket deposited dielectric layer. The gate dielectric layer 122 or 124 may be a high-K gate dielectric layer, including a metal oxide dielectric layer, such as but not limited to hafnium oxide, zirconium oxide, tantalum oxide and titanium oxide, hafnium silicon oxide, lanthanum oxide, lanthanum aluminum oxide, zirconium silicon oxide, barium strontium titanium oxide, barium titanium oxide, strontium titanium oxide, yttrium oxide, aluminum oxide, lead scandium tantalum oxide, and lead zinc niobate, to name a few examples. A high-k metal oxide dielectric layer can be deposited by chemical vapor deposition or sputter deposition, and so forth. In some forms, an annealing process may be carried out on the gate dielectric 122 or 124 to improve its quality when a high-k material is used. In some forms, the gate dielectric 122 or 124 may include a dummy oxide that is subsequently removed in a process flow together with a dummy gate electrode and replaced with a high-k gate dielectric and metal gate. By one example, when gate dielectric layers 122 and 124 are deposited, it may have ends that form on isolation regions 402/118.

The gate electrode 120 may be formed on the gate dielectric 122 and 124, and may be composed of at least one p-type workfunction metal or n-type workfunction metal, depending on whether the transistor is to be a PMOS (for example, p-type) or an NMOS (for example, n-type) transistor. In some implementations, the gate electrode 120 may comprise of two or more metal films or layers, where at least one metal layer is a workfunction metal layer and at least one metal layer is a fill metal layer. In some forms, the gate electrode 120 may be a polysilicon gate electrode. In other implementations as mentioned above, the gate electrode 120 may be a dummy polysilicon gate electrode that is subsequently removed in a process flow and replaced with a metal gate electrode. By one form, gate electrode 120 is formed to a thickness sufficient to completely cover or surround the channel regions of the semiconductor bodies 102 and 104, cladding layers 114 and 116, and gate dielectric layers 122 and 124 as shown in FIG. 1.

For a PMOS transistor, metals that may be used for the gate electrode 120 include, but are not limited to, ruthenium, palladium, platinum, cobalt, nickel, and conductive metal oxides, for example, ruthenium oxide. A p-type metal layer may enable the formation of a PMOS gate electrode with a workfunction that is between about 4.9 eV and about 5.2 eV. For an NMOS transistor, metals that may be used for the gate electrode 120 include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An n-type metal layer may enable the formation of an NMOS gate electrode with a workfunction that is between about 3.9 eV and about 4.2 eV.

The gate electrode may be formed by blanket deposit of the electrode material over insulation layers 118 so that it deposits onto and around gate dielectric layer 122 and 124. That is, the gate electrode material is deposited onto the gate dielectric layer 122 and 124 formed on the cladding layers 114 and 116 formed on the top surface 142 and sidewalls 138 and 140 of semiconductor bodies 102 and 104. Gate electrode material and gate dielectric layer, if not done so already, can be patterned utilizing photolithography and etching techniques. Although, a subtractive process is mentioned, other techniques, such as a replacement gate process may be utilized to form gate electrode 120.

In some forms, a pair of spacers (not shown) may bracket the gate electrode 120, for example, on opposing surfaces of the gate electrode 120. The spacers may be formed from a material such as silicon nitride, silicon oxide, silicon carbide, silicon nitride doped with carbon, and silicon oxynitride. Processes for forming spacers may generally include deposition and etching processes and/or other well-known techniques.

The process 900 also optionally includes "complete integrated circuit" 922 when the semiconductor device 100 or 200, for example, is one of many such devices for an integrated circuit rather than as an isolated transistor. In this case, "back end" techniques can be utilized to form metal contacts, metallization layers and interlayer dielectrics to interconnect various transistors together into functional integrated circuits, such as microprocessors.

While implementation of example process 900, may include the undertaking of all operations shown in the order illustrated, the present disclosure is not limited in this regard and, in various examples, implementation of processes 900 may include the undertaking only a subset of the operations shown and/or in a different order than illustrated.

In addition, any one or more of the blocks of FIG. 9 may be undertaken in response to instructions provided by one or more computer program products. Such program products may include signal bearing media providing instructions that, when executed by, for example, a processor, may provide the functionality described herein. The computer program products may be provided in any form of computer readable medium. Thus, for example, a processor including one or more processor core(s) may undertake one or more of the blocks shown in FIG. 9 in response to instructions conveyed to the processor by a computer readable medium.

Figure 13:
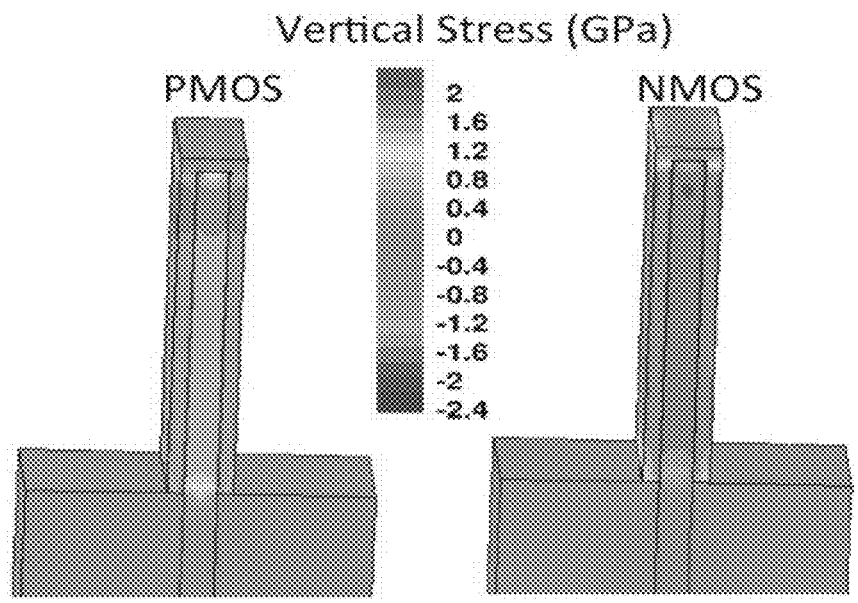
FIGS. 13-14 are graphs showing the vertical and current flow direction stress provided by the semiconductor devices described herein.
Figure 14:
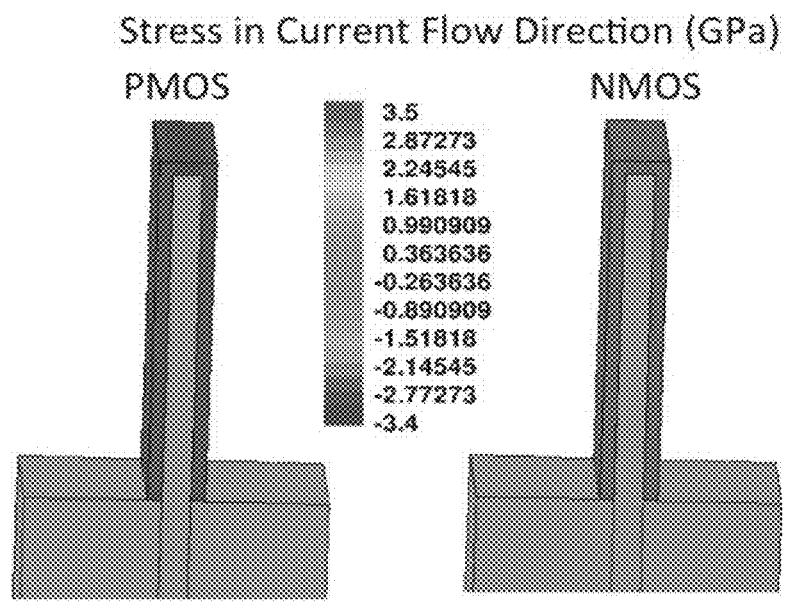

Referring to FIGS. 13-14, an example semiconductor device such as that described above may result in a substantial increase in mobility over that provided by a non-cladded dual fin MOSFET device. A relaxed $Si_{0.50}Ge_{0.50}$ semiconductor layer was used to form the semiconductor bodies, the n-type cladding layer was Si, and the p-type cladding layer was Ge, without Si. The semiconductors were built on (110) wafers with (110) current flow direction and (100) surface sidewalls. The source and drain regions maintained the same materials as the channel cladding and core structure, except here being appropriately doped.

It was determined that the PMOS device resulted in a relatively large compression force in the current flow direction ranging from about 2.7 to 3.4 GPa and some vertical compressive stress from about 0 to 1.6 GPa at the cladding layer. Likewise, the NMOS device resulted in a relatively large tensile force in the current flow direction from about 2.8 to 3.5 GPa and about 0 to 2.0 GPa in the vertical direction. Comparing the mobility with the cladding structure described herein with an unstressed, non-cladded structure, the PMOS device reached a hole mobility of 1073 $cm^2/Vs$ at 5e12 $cm^{-2}$ carrier concentration versus a mobility of 320 $cm^2/Vs$ for an unstressed, non-cladded PMOS device, for a mobility gain of about 3.4. Likewise, the cladded, stressed NMOS device as described herein reached an electron mobility of 521 $cm^2/Vs$ at 5e12 $cm^{-2}$ carrier concentration versus a mobility of 255 $cm^2/Vs$ for an unstressed, non-cladded NMOS device, for a mobility gain of about 2.

A further benefit of the cladding structures is that the stress and improved mobility is maintained for isolated devices (described above). The free surface along the current flow direction in an isolated device allows the strained layer to elastically relax. This elastic relaxation effect is less for a cladding architecture because the core layer helps hold in the stress in the cladding layer.

Figure 15:
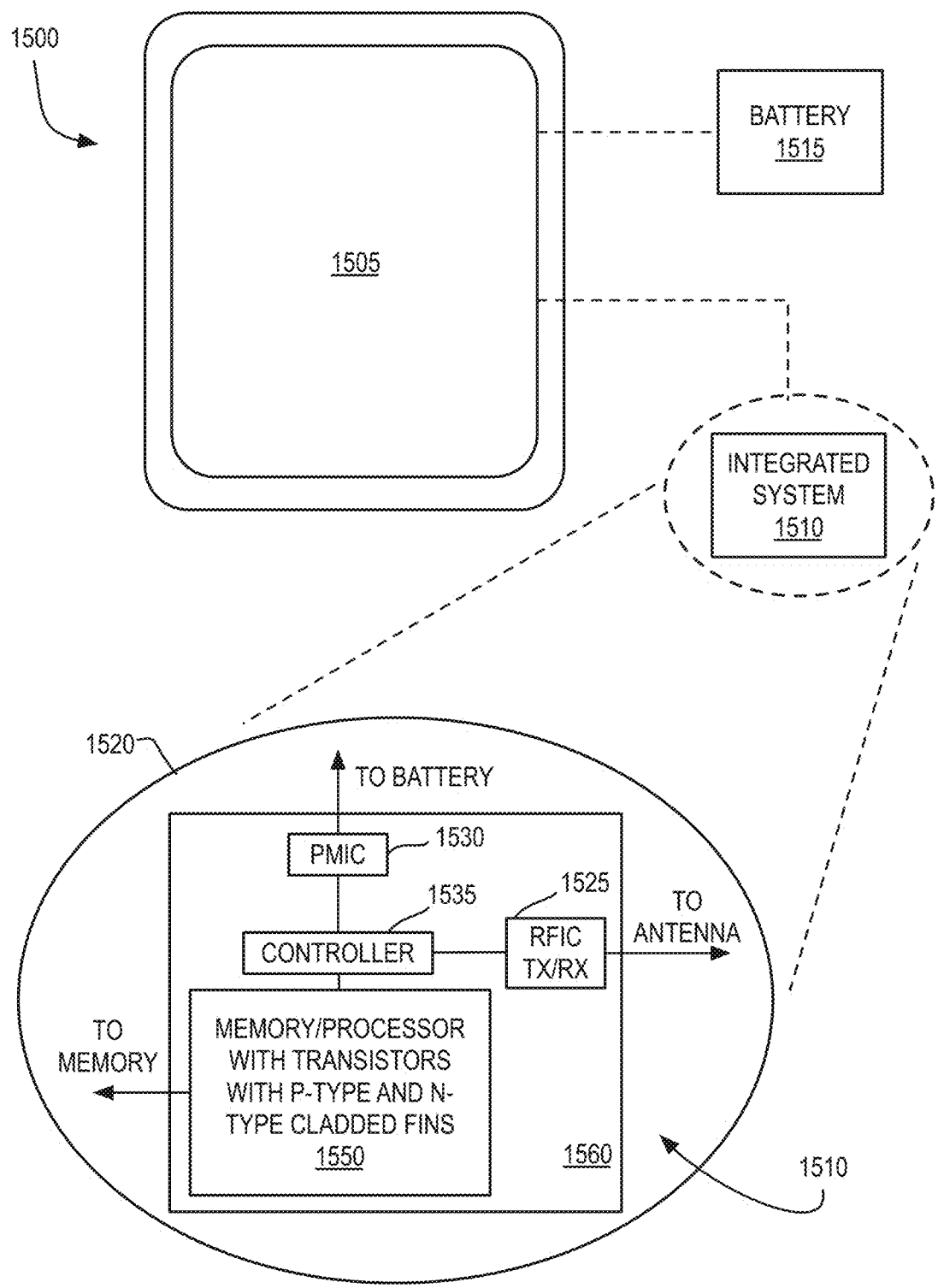
FIG. 15 is an illustrative diagram of a mobile computing platform employing an integrated circuit with transistors having a cladding layer on fins of the transistor.

FIG. 15 is an illustrative diagram of a mobile computing platform employing an IC with transistors having an unrecessed field insulator and thinner electrodes over the field insulator, arranged in accordance with at least some implementations of the present disclosure. Mobile computing platform 1500 may be any portable device configured for each of electronic data display, electronic data processing, wireless electronic data transmission, or the like. For example, mobile computing platform 1500 may be any of a tablet, a smart phone, laptop computer, etc. and may include a display screen 1505, which in the exemplary implementation is a touchscreen (for example, capacitive, inductive, resistive, etc. touchscreen), a chip-level (SoC) or package-level integrated system 1510, and a battery 1515.

Integrated system 1510 is further illustrated in the expanded view 1520. In the exemplary implementation, packaged device 1550 (labeled "Memory/Processor with Transistors with p-type and n-type Cladded Fins" in FIG. 15) includes at least one memory chip (for example, RAM), and/or at least one processor chip (for example, a microprocessor, a multi-core microprocessor, or graphics processor, or the like) employing transistors with p-type and n-type cladded fins as discussed herein. In an implementation, the package device 1550 is a microprocessor including an SRAM cache memory employing transistors with p-type and n-type cladded fins as discussed herein (for example, the SRAM cache memory may include an inverter circuit employing transistors as discussed herein).

An employed transistor may include a semiconductor device with a substrate, a relaxed layer forming both p-type and n-type semiconductor bodies such as fins, and cladding layers over the semiconductor bodies that are different depending on the carrier charge type of the semiconductor body, where the cladding layers are grown by using cover layers and selective epitaxial growth as described herein. Packaged device 1550 may be further coupled to (for example, communicatively coupled to) a board, a substrate, or an interposer 1560 along with, one or more of a power management integrated circuit (PMIC) 1530, RF (wireless) integrated circuit (RFIC) 1525 including a wideband RF (wireless) transmitter and/or receiver (TX/RX) (for example, including a digital baseband and an analog front end module further comprises a power amplifier on a transmit path and a low noise amplifier on a receive path), and a controller thereof 1535. In general, packaged device 1550 may be also be coupled to (for example, communicatively coupled to) display screen 1505.

Functionally, PMIC 1530 may perform battery power regulation, DC-to-DC conversion, etc., and so has an input coupled to battery 1515 and with an output providing a current supply to other functional modules. As further illustrated, in the exemplary implementation, RFIC 1525 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of packaged device 1550 or within a single IC (SoC) coupled to the package substrate of the packaged device 1550.

Figure 16:
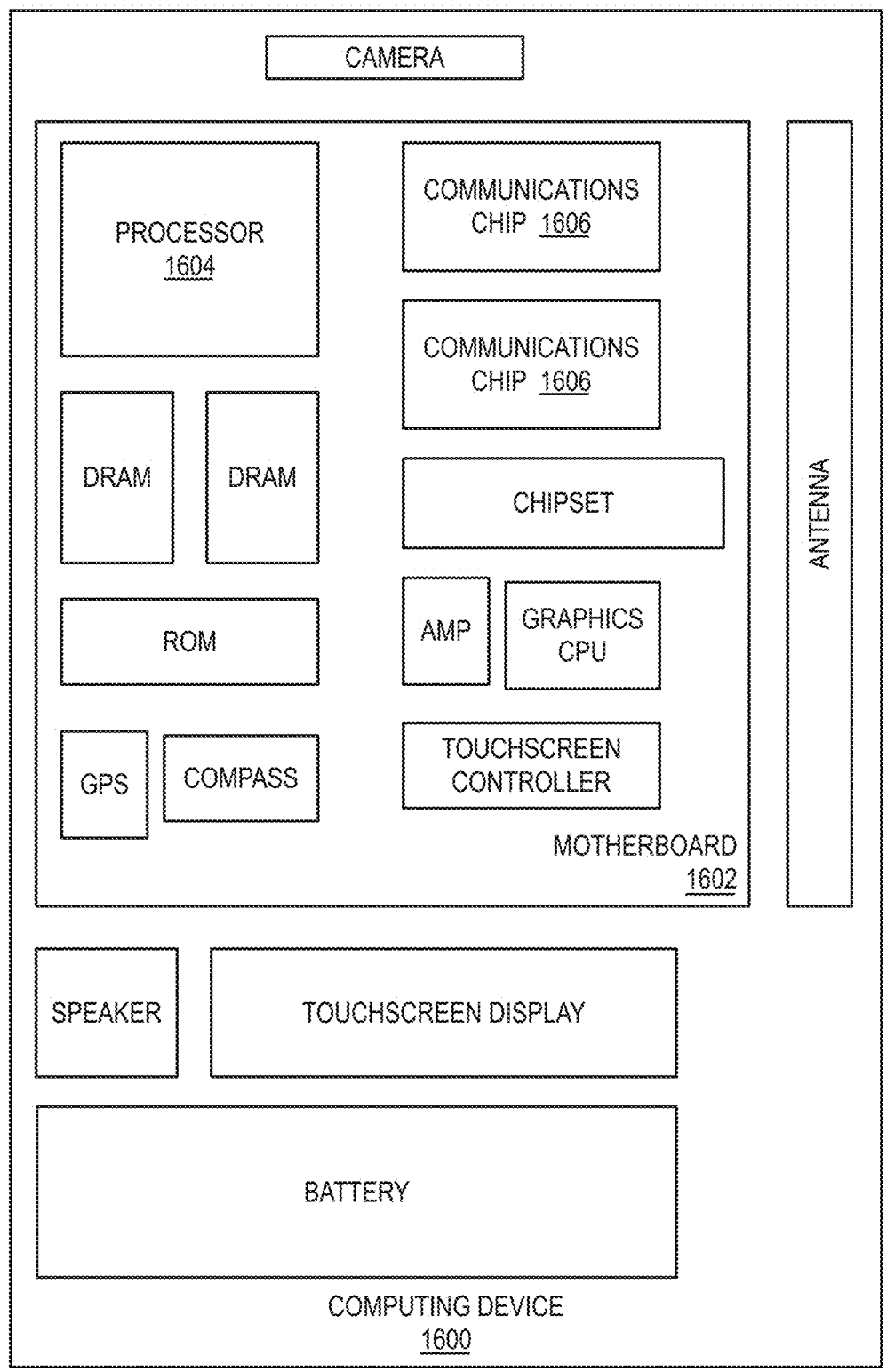
FIG. 16 is a functional block diagram of a computing device, all arranged in accordance with at least some implementations of the present disclosure.

FIG. 16 is a functional block diagram of a computing device 1600, arranged in accordance with at least some implementations of the present disclosure. Computing device 1600 may be found inside platform 1500, for example, and further includes a motherboard 1602 hosting a number of components, such as but not limited to a processor 1604 (for example, an applications processor), which may incorporate transistors with cladded p-type and n-type semiconductor bodies as discussed herein, and at least one communication chip 1606. In implementations, at least one of the processor 1604, one or more communication chips 1606, or the like may be physically and/or electrically coupled to motherboard 1602. In some examples, processor 1604 includes an integrated circuit die packaged within the processor 1604. In general, the term "processor" may refer to any device or portion of a device that processes electronic data from registers and/or memory to transform that electronic data into other electronic data that may be stored in registers and/or memory.

In various examples, one or more communication chips 1606 may also be physically and/or electrically coupled to the motherboard 1602. In further implementations, communication chips 1606 may be part of processor 1604. Depending on its applications, computing device 1600 may include other components that may or may not be physically and electrically coupled to motherboard 1602. These other components include, but are not limited to, volatile memory (for example, DRAM), non-volatile memory (for example, ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid state drive (SSD), compact disk (CD), digital versatile disk (DVD), and so forth), or the like.

Communication chips 1606 may enables wireless communications for the transfer of data to and from the computing device 1600. The term "wireless" and its derivatives may be used to describe circuits, devices, systems, methods, techniques, communications channels, and so forth, that may communicate data through the use of modulated electromagnetic radiation through a non-solid medium. The term does not imply that the associated devices do not contain any wires, although in some implementations they might not. Communication chips 1606 may implement any of a number of wireless standards or protocols, including but not limited to those described elsewhere herein. As discussed, computing device 1600 may include a plurality of communication chips 1606. For example, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

As used in any implementation described herein, the term "module" refers to any combination of software logic, firmware logic and/or hardware logic configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, and/or firmware that stores instructions executed by programmable circuitry. The modules may, collectively or individually, be embodied as circuitry that forms part of a larger system, for example, an integrated circuit (IC), system on-chip (SoC), and so forth. For example, a module may be embodied in logic circuitry for the implementation via software, firmware, or hardware of the coding systems discussed herein.

As used in any implementation described herein, the term "logic unit" refers to any combination of firmware logic and/or hardware logic configured to provide the functionality described herein. The "hardware", as used in any implementation described herein, may include, for example, singly or in any combination, hardwired circuitry, programmable circuitry, state machine circuitry, and/or firmware that stores instructions executed by programmable circuitry. The logic units may, collectively or individually, be embodied as circuitry that forms part of a larger system, for example, an integrated circuit (IC), system on-chip (SoC), and so forth. For example, a logic unit may be embodied in logic circuitry for the implementation firmware or hardware of the coding systems discussed herein. One of ordinary skill in the art will appreciate that operations performed by hardware and/or firmware may alternatively be implemented via software, which may be embodied as a software package, code and/or instruction set or instructions, and also appreciate that logic unit may also utilize a portion of software to implement its functionality.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

The following examples pertain to further implementations.

For one example, a semiconductor device comprises a substrate, at least one p-type semiconductor body, and at least one n-type semiconductor body both disposed over the substrate and both having a semiconductor material comprising SiGe. The individual semiconductor bodies have a channel region disposed between a source region and a drain region. A strained cladding layer may be disposed on the channel region of at least one p-type semiconductor body and at least one n-type semiconductor body, and may have a material that is different depending on whether the semiconductor body is p-type or n-type. A gate dielectric layer may be disposed over the cladding layer, while a gate electrode may be disposed over the gate dielectric layer. A source or drain material may be respectively disposed in each of the source and drain regions.

By another example, a semiconductor device comprises a relaxed layer disposed over the substrate and has upstanding extensions of relaxed silicon germanium (SiGe) forming both the p-type semiconductor bodies and the n-type semiconductor bodies. Therein, the semiconductor bodies are formed of relaxed SiGe having a larger lattice constant than the lattice constant of the cladding layer on the n-type semiconductor body and having a smaller lattice constant than the lattice constant of the cladding layer on the p-type semiconductor body. The semiconductor device comprises a compression stress at the cladding layer on the p-type semiconductor body, and a tensile stress at the cladding layer on the n-type semiconductor body. Also, the semiconductor device includes at least one of: (1) the cladding layer on the p-type semiconductor body is SiGe or Ge, and wherein the cladding layer on the n-type semiconductor body is Si, and (2) the cladding layer on the p-type semiconductor device is SiGe with a greater proportion of Ge than in the SiGe of the semiconductor body. The source and drain regions may comprise at least one of (a) the same material as the cladding layer on the same semiconductor body, and (b) a material that causes strain in the source and drain regions due to proximity with relaxed material of the semiconductor body. The semiconductor device comprises an isolation layer in contact with both the p-type semiconductor body and the n-type semiconductor body. Additionally, the semiconductor bodies are fins having sidewalls and a channel flow direction extending through the channel region, and the fins have lattices oriented so that the fins have (100) sidewall surfaces and (110) orientation facing the channel flow and at the cladding layer.

By another approach, a mobile computing platform comprises a microprocessor comprises a substrate, at least one p-type semiconductor body, and at least one n-type semiconductor body both disposed over the substrate and both having a semiconductor material comprising SiGe. The individual semiconductor bodies have a channel region disposed between a source region and a drain region. A strained cladding layer may be disposed on the channel region of at least one p-type semiconductor body and at least one n-type semiconductor body, and may have a material that is different depending on whether the semiconductor body is p-type or n-type. A gate dielectric layer may be disposed over the cladding layer, while a gate electrode may be disposed over the gate dielectric layer. A source or drain material may be respectively disposed in each of the source and drain regions. A display screen may be communicatively coupled to the microprocessor, and a wireless transceiver may be communicatively coupled to the microprocessor.

By yet another approach, the mobile computing platform comprises a relaxed layer disposed over the substrate and has upstanding extensions of relaxed silicon germanium (SiGe) forming both the p-type semiconductor bodies and the n-type semiconductor bodies. The semiconductor bodies are formed of relaxed SiGe having a larger lattice constant than the lattice constant of the cladding layer on the n-type semiconductor body and having a smaller lattice constant than the lattice constant of the cladding layer on the p-type semiconductor body. The microprocessor comprises a compression stress at the cladding layer on the p-type semiconductor body, and a tensile stress at the cladding layer on the n-type semiconductor body. Also, the microprocessor includes at least one of: (1) the cladding layer on the p-type semiconductor body is SiGe or Ge, and wherein the cladding layer on the n-type semiconductor body is Si, and (2) the cladding layer on the p-type semiconductor device is SiGe with a greater proportion of Ge than in the SiGe of the semiconductor body. The source and drain regions may comprise the same material as the cladding layer on the same semiconductor body. The microprocessor comprises an isolation layer in contact with both the p-type semiconductor body and the n-type semiconductor body. Additionally, the semiconductor bodies are fins having sidewalls and a channel flow direction extending through the channel region, and the fins have lattices oriented so that the fins have (100) sidewall surfaces and (110–) orientation facing the channel flow direction and at the cladding layer.

By a further implementation, a method of fabricating a semiconductor device comprises forming at least one p-type semiconductor body and at least one n-type semiconductor body over a substrate, wherein the semiconductor bodies have a source region, a channel region, and a drain region, and wherein at least the channel region is formed of a material that comprises SiGe, depositing a removable cover layer over at least part of the semiconductor bodies of both a first carrier charge type and a second carrier charge type, wherein the first and second carrier charge types are different and comprise p-type or n-type, forming openings through the removable cover layer to expose at least the channel region of the semiconductor bodies of a first carrier charge type, forming a first cladding layer on the exposed semiconductor bodies of the first carrier charge type, providing a removable cover layer over at least part of the semiconductor bodies of the first carrier charge type, forming openings through a removable cover layer to expose at least the channel region of the semiconductor bodies of the second carrier charge type, and forming a second cladding layer on the exposed semiconductor bodies of the second carrier charge type.

By yet another implementation, a method of fabricating a semiconductor device comprises forming the second cladding layer of a different material than the material of the first cladding layer, wherein the material is different depending, at least in part, on the type of carrier charge of the semiconductor body in contact with the cladding layer. The forming of the semiconductor bodies comprises forming a relaxed layer over the substrate, and forming upstanding extensions of relaxed silicon germanium (SiGe) forming both the p-type semiconductor bodies and the n-type semiconductor bodies. The forming of the first cladding layer and the second cladding layer comprises selectively epitaxially growing the first and second cladding layers at the openings. Also, forming the semiconductor bodies comprises forming the semiconductor bodies with relaxed SiGe having a larger lattice constant than the lattice constant of the cladding layer on the n-type semiconductor body and having a smaller lattice constant than the lattice constant of the cladding layer on the p-type semiconductor body. The method comprises at least one of (a) forming the cladding layer on the p-type semiconductor body of SiGe or Ge, and forming the cladding layer on the n-type semiconductor body of Si, and (b) forming the cladding layer on the p-type semiconductor body of SiGe with a greater proportion of Ge than in the SiGe of the semiconductor body. Depositing the removable cover layer comprises depositing a first removable cover layer, and the method comprises at least one of:

(1) removing the first removable cover layer after the first cladding layer is formed, providing a second removable cover layer to cover the at least part of the semiconductor bodies of the first carrier charge type and the first cladding layer, and removing the second removable cover layer after the second cladding layer is formed, and (2) providing a second removable cover layer to cover the at least part of the semiconductor bodies of the first carrier charge type and the first cladding layer, forming an opening through at least the first removable cover layer to expose at least part of the semiconductor bodies of the second carrier charge type, and removing both the first and second removable cover layers.

Depositing a cladding layer on the p-type semiconductor body forms a compressive stress at the cladding layer, and depositing a cladding layer on the n-type semiconductor body forms a tensile stress at the cladding layer on the n-type semiconductor body. The method comprises forming a source and drain region on either side of the channel region on at least one of the semiconductor bodies, and wherein the source and drain regions comprise at least one of (a) the same material as the cladding layer on the same semiconductor body, and (b) a material that causes strain in the source and drain regions due to proximity with relaxed material of the semiconductor body. The method also comprises forming an insulation layer in contact with both a p-type semiconductor body and an n-type semiconductor body. Additionally, the method comprises forming the semiconductor bodies as fins having sidewalls and a channel flow direction extending through the channel region, and the fins have lattices oriented so that the fins have (100) sidewall surfaces and (110) orientation facing the channel flow direction and at the cladding layer.

In one example, a microprocessor may include an SRAM cache memory further having a transistor including any one of the above example structures.

In a further example, a mobile computing platform may include any of the example structures.

In yet another example, an apparatus is made by performing the method according to any of the examples herein.

In yet a further example, a mobile computing platform may comprise a semiconductor device formed by any of the methods herein.

By another example, a microprocessor comprising a transistor may comprise any one of the semiconductor devices described herein.

It will be recognized that the invention is not limited to the implementations so described, but can be practiced with modification and alteration without departing from the scope of the appended claims. For example, the above implementations may include specific combination of features. However, the above implementations are not limited in this regard and, in various implementations, the above implementations may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A semiconductor device, comprising:
    a substrate;
    a relaxed layer disposed over the substrate and having a semiconductor material comprising SiGe, the relaxed layer comprising:
        a base portion disposed over the substrate, and
        at least one p-type semiconductor body and at least one n-type semiconductor body extending from the base portion opposite from the substrate, the individual semiconductor bodies having a channel region disposed between a source region and a drain region, the individual semiconductor bodies having a lower portion adjacent the base portion and an upper portion, wherein the base portion has a higher defect concentration as compared to the upper portion;
    a strained cladding layer disposed on the channel region of at least one p-type semiconductor body and at least one n-type semiconductor body, wherein the strained cladding layer is disposed on the upper portion of the at least one p-type semiconductor body and at least one n-type semiconductor body without being disposed on the lower portion of the at least one p-type semiconductor body and at least one n-type semiconductor body, and having a material that is different depending on whether the semiconductor body is p-type or n-type;
    a gate dielectric layer disposed over the cladding layers;
    a gate electrode disposed over the gate dielectric layers; and source or drain material respectively disposed in each of the source and drain regions.

2. The semiconductor device of claim 1 comprising a relaxed layer disposed over the substrate and having upstanding extensions of relaxed silicon germanium (SiGe) forming both the p-type semiconductor bodies and the n-type semiconductor bodies.

3. The semiconductor device of claim 1 wherein the semiconductor bodies are formed of relaxed SiGe having a larger lattice constant than the lattice constant of the cladding layer on the n-type semiconductor body and having a smaller lattice constant than the lattice constant of the cladding layer on the p-type semiconductor body.

4. The semiconductor device of claim 1 comprising a compression stress at the cladding layer on the p-type semiconductor body, and a tensile stress at the cladding layer on the n-type semiconductor body.

5. The semiconductor device of claim 1 wherein the cladding layer on the p-type semiconductor body is SiGe or Ge, and wherein the cladding layer on the n-type semiconductor body is Si.

6. The semiconductor device of claim 5 wherein the cladding layer on the p-type semiconductor body is SiGe with a greater proportion of Ge than in the SiGe of the semiconductor body.

7. The semiconductor device of claim 1 wherein the source and drain regions comprise at least one of:
the same material as the cladding layer on the same semiconductor body, and
a material that causes strain in the source and drain regions due to proximity with relaxed material of the semiconductor body.

8. The semiconductor device of claim 1 comprising a relaxed layer disposed over the substrate and having upstanding extensions of relaxed silicon germanium (SiGe) forming both the p-type semiconductor bodies and the n-type semiconductor bodies;
wherein the semiconductor bodies are formed of relaxed SiGe having a larger lattice constant than the lattice constant of the cladding layer on the n-type semiconductor body and having a smaller lattice constant than the lattice constant of the cladding layer on the p-type semiconductor body;
the semiconductor device comprising a compression stress at the cladding layer on the p-type semiconductor body, and a tensile stress at the cladding layer on the n-type semiconductor body;
wherein at least one of:
the cladding layer on the p-type semiconductor body is SiGe or Ge, and wherein the cladding layer on the n-type semiconductor body is Si, and
the cladding layer on the p-type semiconductor body is SiGe with a greater proportion of Ge than in the SiGe of the semiconductor body;
wherein the source and drain regions comprise at least one of:
the same material as the cladding layer on the same semiconductor body, and
a material that causes strain in the source and drain regions due to proximity with relaxed material of the semiconductor body;
the semiconductor device comprising an isolation layer in contact with both the p-type semiconductor body and the n-type semiconductor body; and
wherein the semiconductor bodies are fins having sidewalls and a current flow direction extending through the channel region, and wherein the fins have lattices oriented so that the fins have (100) sidewall surfaces and (110) orientation in a channel flow direction and at the cladding layer.

9. A mobile computing platform comprising:
a microprocessor comprising:
a substrate;
a relaxed layer disposed over the substrate and having a semiconductor material comprising SiGe, the relaxed layer comprising:
a base portion disposed over the substrate, and
at least one p-type semiconductor body and at least one n-type semiconductor body extending from the base portion opposite from the substrate, the individual semiconductor bodies having a channel region disposed between a source region and a drain region, the individual semiconductor bodies having a lower portion adjacent the base portion and an upper portion, wherein the base portion has a higher defect concentration as compared to the upper portion;
a strained cladding layer disposed on a channel region of at least one p-type semiconductor body and at least one n-type semiconductor body, wherein the strained cladding layer is disposed on the upper portion of the at least one p-type semiconductor body and at least one n-type semiconductor body without being disposed on the lower portion of the at least one p-type semiconductor body and at least one n-type semiconductor body, and having a material that is different depending on whether the semiconductor body is p-type or n-type;
a gate dielectric disposed layer over the cladding layers;
a gate electrode disposed over the gate dielectric layers; and
source or drain material respectively disposed in each of the source and drain regions;
a display screen communicatively coupled to the microprocessor; and
a wireless transceiver communicatively coupled to the microprocessor.

10. The platform of claim 9 comprising a relaxed layer disposed over the substrate and having upstanding extensions of relaxed silicon germanium (SiGe) forming both the p-type semiconductor bodies and the n-type semiconductor bodies;
wherein the semiconductor bodies are formed of relaxed SiGe having a larger lattice constant than the lattice constant of the cladding layer on the n-type semiconductor body and having a smaller lattice constant than the lattice constant of the cladding layer on the p-type semiconductor body;
the microprocessor comprising a compression stress at the cladding layer on the p-type semiconductor body, and a tensile stress at the cladding layer on the n-type semiconductor body;
wherein at least one of:
the cladding layer on the p-type semiconductor body is SiGe or Ge, and wherein the cladding layer on the n-type semiconductor body is Si, and
the cladding layer on the p-type semiconductor body is SiGe with a greater proportion of Ge than in the SiGe of the semiconductor body;
wherein the source and drain regions comprise at least one of:
the same material as the cladding layer on the same semiconductor body, and
a material that causes strain in the source and drain regions due to proximity with relaxed material of the semiconductor body;

the microprocessor comprising an isolation layer in contact with both the p-type semiconductor body and the n-type semiconductor body; and wherein the semiconductor bodies are fins having sidewalls and a channel flow direction extending through the channel region, and wherein the fins have lattices oriented so that the fins have (100) sidewall surfaces and (110) orientation facing the channel flow direction and at the cladding layer.

11. A method of fabricating a semiconductor device, comprising:
   forming a relaxed layer disposed over a substrate and having a semiconductor material comprising SiGe, the relaxed layer comprising:
      a base portion disposed over the substrate, and
      at least one p-type semiconductor body and at least one n-type semiconductor body extending from the base portion opposite from the substrate, wherein the semiconductor bodies have a source region, a channel region, and a drain region, and wherein at least the channel region is formed of a material that comprises SiGe, the individual semiconductor bodies having a lower portion adjacent the base portion and an upper portion, wherein the base portion has a higher defect concentration as compared to the upper portion;
   depositing a removable cover layer over at least part of the semiconductor bodies of both a first carrier charge type and a second carrier charge type, wherein the first and second carrier charge types are different and comprise p-type or n-type;
   forming openings through the removable cover layer to expose at least the channel region of the semiconductor bodies of a first carrier charge type
   forming a first cladding layer on the exposed semiconductor bodies of the first carrier charge type, wherein the first cladding layer is disposed on the upper portion of the exposed semiconductor bodies of the first carrier charge type without being disposed on the lower portion of the exposed semiconductor bodies of the first carrier charge type,
   providing a removable cover layer over at least part of the semiconductor bodies of the first carrier charge type;
   forming openings through a removable cover layer to expose at least the channel region of the semiconductor bodies of the second carrier charge type; and
   forming a second cladding layer on the exposed semiconductor bodies of the second carrier charge type, wherein the second cladding layer is disposed on the upper portion of the exposed semiconductor bodies of the second carrier charge type without being disposed on the lower portion of the exposed semiconductor bodies of the second carrier charge type.

12. The method of claim 11 comprising forming the second cladding layer of a different material than the material of the first cladding layer, wherein the material is different depending, at least in part, on the type of carrier charge of the semiconductor body in contact with the cladding layer.

13. The method of claim 11 wherein forming the semiconductor bodies comprises:
   forming a relaxed layer over the substrate and having upstanding extensions of relaxed silicon germanium (SiGe) forming both the p-type semiconductor bodies and the n-type semiconductor bodies.

14. The method of claim 11 wherein depositing the first cladding layer and the second cladding layer comprises selectively epitaxially growing the first and second cladding layers at the openings.

15. The method of claim 11 wherein forming the semiconductor bodies comprises forming the semiconductor bodies with relaxed SiGe having a larger lattice constant than the lattice constant of the cladding layer on the n-type semiconductor body and having a smaller lattice constant than the lattice constant of the cladding layer on the p-type semiconductor body.

16. The method of claim 11 comprising forming the cladding layer on the p-type semiconductor body of SiGe or Ge, and forming the cladding layer on the n-type semiconductor body of Si.

17. The method of claim 16 comprising forming the cladding layer on the p-type semiconductor body of SiGe with a greater proportion of Ge than in the SiGe of the semiconductor body.

18. The method of claim 11 wherein depositing the removable cover layer comprises depositing a first removable cover layer, the method comprising:
   removing the first removable cover layer after the first cladding layer is formed, providing a second removable cover layer to cover the at least part of the semiconductor bodies of the first carrier charge type and the first cladding layer, and
   removing the second removable cover layer after the second cladding layer is formed.

19. The method of claim 11 wherein depositing the removable cover layer comprises depositing a first removable cover layer, the method comprising:
   providing a second removable cover layer to cover the at least part of the semiconductor bodies of the first carrier charge type and the first cladding layer;
   forming an opening through at least the first removable cover layer to expose at least part of the semiconductor bodies of the second carrier charge type; and
   removing both the first and second removable cover layers.

20. The method of claim 11 comprising forming the second cladding layer of a different material than the material of the first cladding layer, wherein the material is different depending, at least in part, on the type of carrier charge of the semiconductor body in contact with the cladding layer;
wherein forming the semiconductor bodies comprises:
   forming a relaxed layer over the substrate and having upstanding extensions of relaxed silicon germanium (SiGe) forming both the p-type semiconductor bodies and the n-type semiconductor bodies;
   wherein forming the first cladding layer and the second cladding layer comprises selectively epitaxially growing the first and second cladding layers at the openings;
   wherein forming the semiconductor bodies comprises forming the semiconductor bodies with relaxed SiGe having a larger lattice constant than the lattice constant of the cladding layer on the n-type semiconductor body and having a smaller lattice constant than the lattice constant of the cladding layer on the p-type semiconductor body;
   the method comprising forming the cladding layer on the p-type semiconductor body of SiGe or Ge, and forming the cladding layer on the n-type semiconductor body of Si;

the method comprising forming the cladding layer on the p-type semiconductor body of SiGe with a greater proportion of Ge than in the SiGe of the semiconductor body;

wherein depositing the removable cover layer comprises depositing a first removable cover layer, and the method comprising at least one of:
(1) removing the first removable cover layer after the first cladding layer is formed,
providing a second removable cover layer to cover the at least part of the semiconductor bodies of the first carrier charge type and the first cladding layer, and
removing the second removable cover layer after the second cladding layer is formed, and
(2) providing a second removable cover layer to cover the at least part of the semiconductor bodies of the first carrier charge type and the first cladding layer;
forming an opening through at least the first removable cover layer to expose at least part of the semiconductor bodies of the second carrier charge type; and
removing both the first and second removable cover layers;
wherein depositing a cladding layer on the p-type semiconductor body forms a compression stress at the cladding layer, and depositing a cladding layer on the n-type semiconductor body forms a tensile stress at the cladding layer on the n-type semiconductor body;

the method comprising forming a source and drain region on either side of the channel region on at least one of the semiconductor bodies, and wherein the source and drain regions comprise at least one of:
the same material as the cladding layer on the same semiconductor body, and
a material that causes strain in the source and drain regions due to proximity with relaxed material of the semiconductor body; and the method comprising forming an insulation layer in contact with both a p-type semiconductor body and an n-type semiconductor body; and the method comprising forming the semiconductor bodies as fins having sidewalls and a channel flow direction extending through the channel region, and wherein the fins have lattices oriented so that the fins have (100) sidewall surfaces and (110) orientation facing the channel flow direction and at the cladding layer.

* * * * *